United States Patent [19]
Saito et al.

[11] Patent Number: 5,523,172
[45] Date of Patent: Jun. 4, 1996

[54] MAGNETORESISTANCE EFFECT ELEMENT

[75] Inventors: Yoshiaki Saito, Yokohama; Shiho Okuno, Kawasaki; Koichiro Inomata, Yokohama, all of Japan

[73] Assignee: Kabushiki Kaisha Toshiba, Kawasaki, Japan

[21] Appl. No.: 234,863

[22] Filed: Apr. 28, 1994

Related U.S. Application Data

[63] Continuation of Ser. No. 858,413, Mar. 27, 1992, abandoned.

[30] Foreign Application Priority Data

Mar. 29, 1991 [JP] Japan .................... 3-065788

[51] Int. Cl.$^6$ .................................................. G11B 5/00
[52] U.S. Cl. .................... 428/611; 428/635; 428/928; 428/670; 428/673; 428/675
[58] Field of Search .................................. 428/611, 622, 428/623, 635, 928, 670, 675, 673, 676, 632, 630, 672; 360/113

[56] References Cited

U.S. PATENT DOCUMENTS

| | | | |
|---|---|---|---|
| 5,134,533 | 7/1992 | Friedrich et al. | 360/113 |
| 5,243,316 | 9/1993 | Sakakima et al. | 338/32 R |
| 5,365,212 | 11/1994 | Saito et al. | 338/32 R |
| 5,388,019 | 2/1995 | Argyle et al. | 360/126 |

FOREIGN PATENT DOCUMENTS 2-23681  1/1990  Japan .

OTHER PUBLICATIONS

Dieny et al., Physical Review, 43 (1991) 1 Jan., "Giant Magnetoresistance in Soft Ferromagnetic Multilayers." pp. 1297–1300.

Nguyen–Van–Dai et al., Revue de Physique, 25 (1990) "Recent Adveincesin Molecular Beam Epitaxy of Metallic Multilayers and Superlattices." pp. 971–976. Oct.

Primary Examiner—David A. Simmons
Assistant Examiner—Linda L. Gray
Attorney, Agent, or Firm—Oblon, Spivak, McClelland, Maier & Neustadt

[57] ABSTRACT

A magnetoresistance effect element comprises the multilayer formed by alternately stacking magnetic and nonmagnetic layers. The magnetic layers containing at least two magnetic elements selected from a group of magnetic elements consisting of Fe, Co and Ni. Any two magnetic layers adjacent to each other with one of the nonmagnetic layer interposed therebetween are antiferromagnetically coupled under a condition where a magnetic field is not substantially applied thereto.

3 Claims, 7 Drawing Sheets

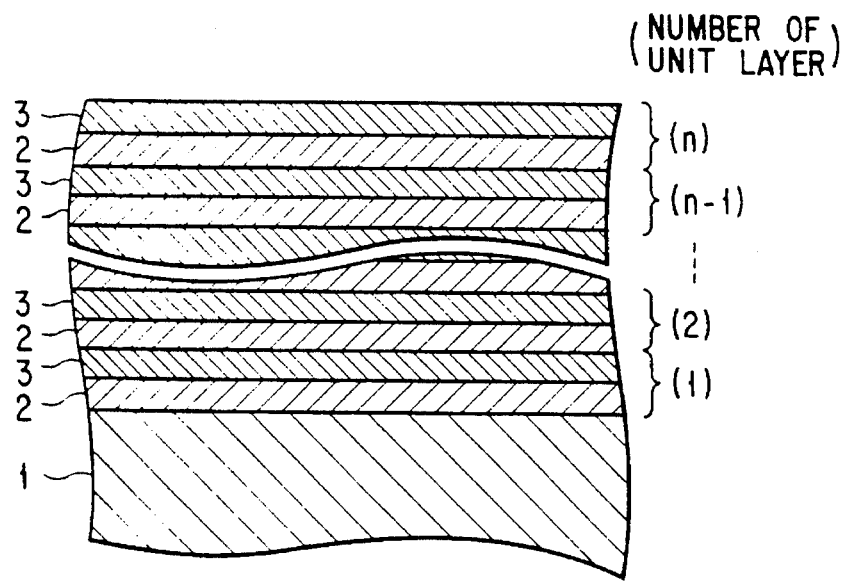
F I G. 1
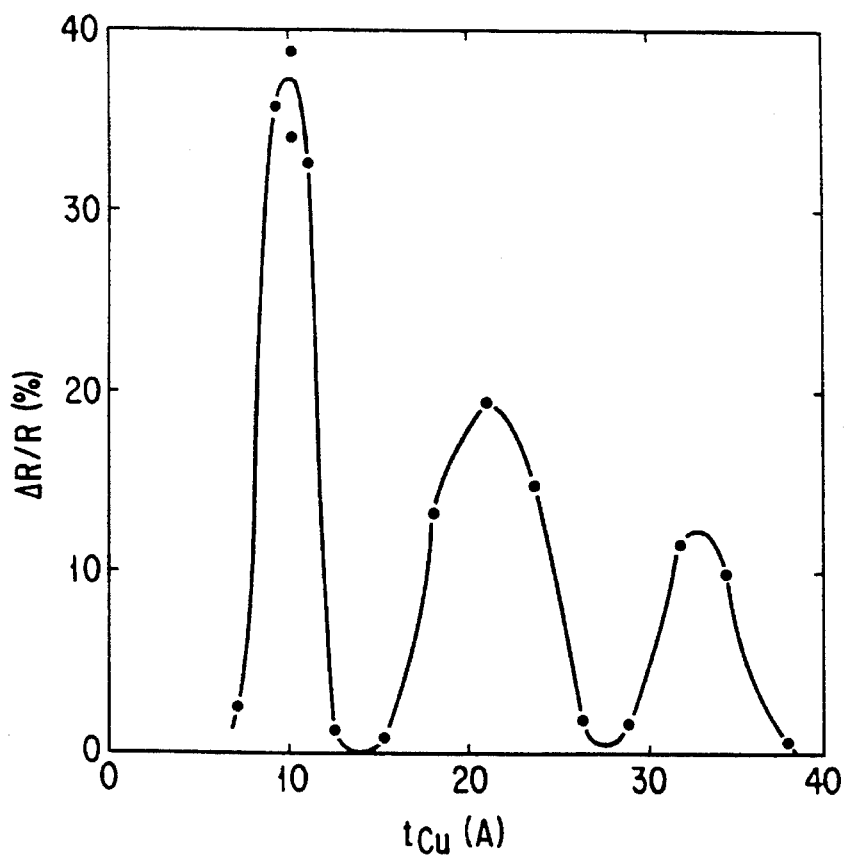
F I G. 2

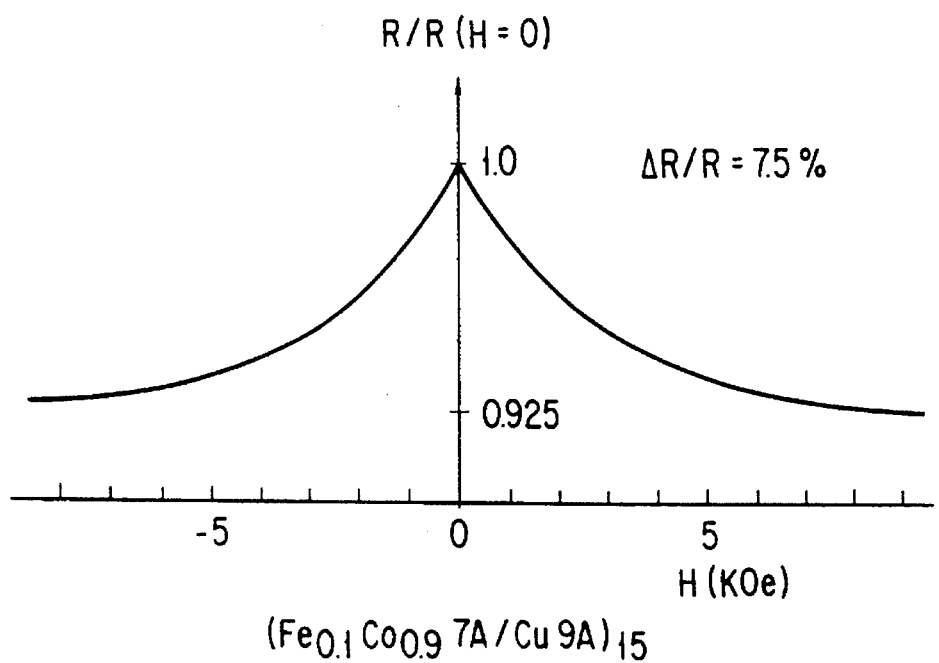
F I G. 4
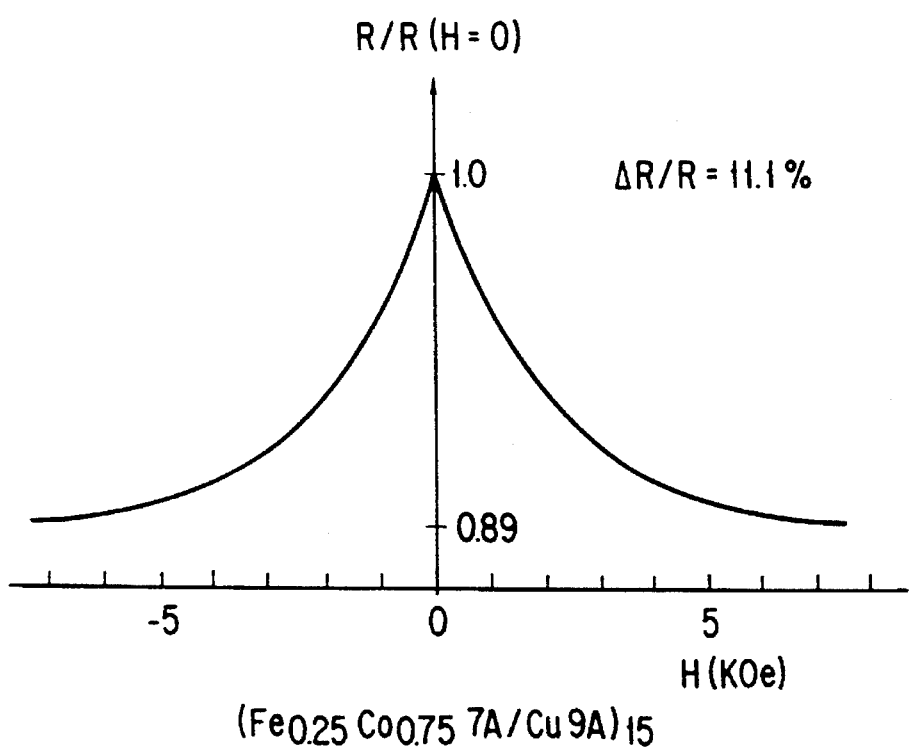
F I G. 5

$(Fe_{0.1}Co_{0.9}\ 15\text{\AA}/Cu\ 9\text{\AA})_{15}$ $(Fe_{0.75}Co_{0.25}\ 20\text{\AA}/Cu\ 13\text{\AA})$

MAGNETORESISTANCE EFFECT ELEMENT

The present application is a continuation of U.S. application Ser. No. 07/858,413, filed Mar. 27, 1992, now abandoned.

BACKGROUND OF THE INVENTION

1. Field of the Invention

This invention relates to a magnetoresistance effect element formed by using multilayer of ultra-thin layers or a so-called artificial lattice film.

2. Description of the Related Art

The magnetoresistance effect is an effect of varied resistance of an object caused by the variation in the intensity of the magnetic field applied to it. Magnetoresistance effect elements that utilize this effect find a variety of applications including those for magnetic field sensors and magnetic heads because of the high sensitivity to magnetic fields and the ability to produce a relatively large output of such elements. While Permalloy thin film is wide used for magnetoresistance effect elements, the magnetoresistance ratio of a Permalloy foil ($\Delta R/Rs$: where $\Delta R$ is the electric resistance change between zero magnetic field and saturated magnetic field; Rs is saturation resistivity) is as low as 2 or 3% and, therefore, does show a satisfactory sensitivity to changes in the magnetic field required for a magnetoresistance effect element.

Meanwhile, as new magnetoresistance effect element, multilayer formed by alternately stacking magnetic and nonmagnetic layers having a thickness of several to tens of Angstroms or so-called artificial lattice films have been attracting attention. Known types of artificial lattice film include $(Fe/Cr)_n$ (Phys. Rev. Lett. vol. 61(21) (1988)2472), (Per malloy/Cu/Co/Cu)$_n$ (J. Phys. SOC. Jap. vol. 59(9) (1990) 3061) and $(Co/Cu)_n$ (J. Mag. Mag. Mat. 94, (1991)L1; Phys. Rev. Lett. 66(1991)2152).

While an artificial lattice film can present a dramatically enhanced magnetoresistance effect when compared with a Permalloy thin film, artificial lattice films having a remarkable magnetoresistance effect can be currently produced only by a film forming apparatus capable of carrying out a supervacuum processing, which uses a supervacuum technique such as the ultra-high vacuum evaporation (UHV) method or the molecular beam epitaxy (MBE) method. Artificial lattice films prepared in an ordinary film forming apparatus do not unfortunately show a satisfactory magnetoresistance effect.

SUMMARY OF THE INVENTION

In view of these circumstances, it is therefore an object of the present invention to provide a magnetoresistance effect element which has large magnetoresistance ratio and which can be applied to a practical use even when the element is produced in an ordinary thin film forming apparatus.

According to the invention, the above object is achieved by providing a magnetoresistance effect element comprising multilayer formed by stacking magnetic and nonmagnetic layers, said magnetic layers containing at least two magnetic elements selected from Fe, Co and Ni, any two magnetic layers adjacent to each other with one of said nonmagnetic layer interposed therebetween being antiferromagnetically coupled under a condition where a magnetic field is not substantially applied thereto.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 a schematic sectional view of a magnetoresistance effect element according to an embodiment of the present invention.

FIG. 2 is a graph illustrating the relationship between the thickness of a nonmagnetic layer of magnetic multilayer and magnetoresistance ratio of the element.

FIG. 4 is a graph showing the magnetoresistance ratio of Example 1.

FIG. 5 is a graph showing the magnetoresistance curve of Example 2.

DETAILED DESCRIPTION OF THE PREFERRED EMBODIMENTS

Figure 3:
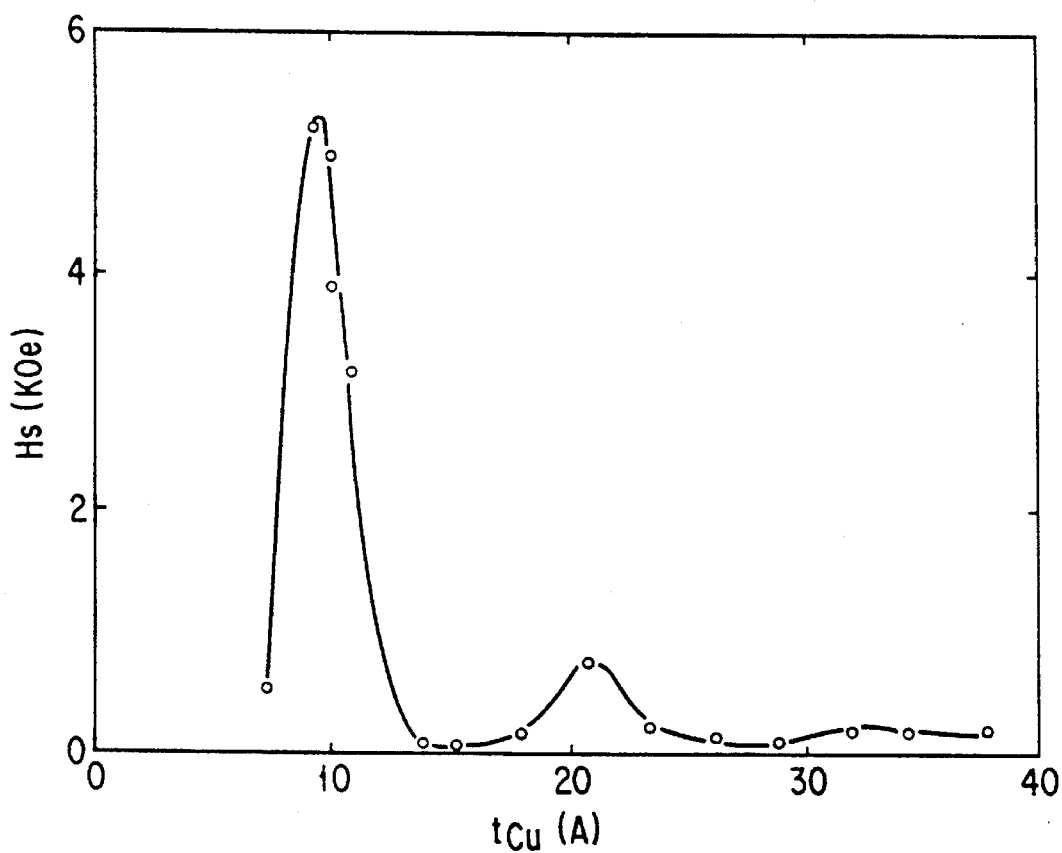
FIG. 3 is a graph illustrating the relationship between the thickness of a nonmagnetic layer of magnetic multilayer and saturated field of the element.

As a result of intensive research efforts of the inventors of the present invention to develop artificial lattice films that show a large magnetoresistive effect, they came to find that the magnetoresistance effect of a $(Co/Cu)_n$ type artificial lattice film is remarkably enhanced when the Co is partly substituted by Fe. They also found that the effect can be obtained when the magnetic layers contain at least two of Fe, Co and Ni and the effect is particularly large when any two neighboring magnetic layers are antiferromagnetically coupled under a condition where a magnetic field is not substantially applied thereto. The present invention is achieved based on the findings of the present inventors.

The present invention will now be explained in detail.

A magnetoresistance effect element according to the present invention comprises a multilayer prepared by alternately stacking magnetic and nonmagnetic layers and typically has a configuration as shown in FIG. 1, where a total of n identical combinations of a nonmagnetic layer 2 and a magnetic layer 3 are vertically stacked on a substrate 1. Here, the lowest layer may be a nonmagnetic one or a magnetic one. A buffer layer made of a soft magnetic material may be interposed between the substrate 1 and the multilayer.

The magnetic layers contain at least two of Fe, Co and Ni as main components. In other words, they are made of an Fe-Co alloy, an Fe-Ni alloy, an Fe-Ni-Co alloy or Co-Ni alloy, although they may contain other elements. Of the above alloys, an Fe-Co alloy is preferable in order to obtain a large magnetoresistance change. For Fe-Ni alloy, the use of a Permalloy represented by formula $Ni_{1-x}Fe_x$ (where $0<x\leq 0.64$) is preferable in order to obtain a relatively large magnetoresistance change with low saturation field. The magnetic permeability and the magnetoresistance ratio of the Permalloy can be improved by substituting the Fe contained there with another element (e.g., Mo, Mn, Cu, Cr). The magnetic layers preferably have in-plane uniaxial magnetic anisotropy.

It is preferable that any neighboring ones of the magnetic layers are antiferromagnetically coupled under a condition where a magnetic field is not substantially applied thereto. Here, "antiferromagnetically coupled" means that the layers are coupled in such a manner that the magnetic moments of any two neighboring magnetic layers are inversely directed. Such an arrangement of coupling can increase the magnetoresistance ratio. On the other hand, the force with which neighboring layers are antiferromagnetically coupled is preferably as small as possible because the smaller the antiferromagnetically coupling force is, the smaller the saturation field ($H_S$) is, and therefore the more advantageous for applications including those for magnetic heads. It is advantageous that the saturated magnetic field $H_S$ of an element according to the invention is small in view of increasing the magnetoresistance ratio ($\Delta R/R$) by using small magnetic field.

Any material may be used for the nonmagnetic layers of an element according to the present invention as far as the material allows the element to have the magnetoresistance effect. Preferable materials that can be used for nonmagnetic layers for the purpose of the present invention include Cu, Cr, Au, Ag and Ru, which may be used as a single material or in the form of an alloy containing any of them. When a nonmagnetic layer made of Cu-Au alloy, the antiferromagnetic coupling force between two neighboring layers can be reduced.

While magnetic metal layers and nonmagnetic layers may be combined in many different ways, the following combinations are recommendable from the viewpoint of obtaining large magnetoresistance effect.

1) The magnetic layers are made of an alloy represented by formula $Fe_{1-x}Co_x$ (where $0.5\leq x<1$, preferably $0.5\leq x\leq 0.999$) and the nonmagnetic layers are made of Cu.

2) The magnetic layers are made of an alloy represented by formula $Fe_{1-x}Co_x$ (where $0<x\leq 0.8$, preferably $0<x\leq 0.5$) and the nonmagnetic layers are made of Cr.

3) The magnetic layers are made of an alloy represented by formula $Ni_{1-y}(Fe_{1-x}Co_x)_y$, where $0\leq x\leq 1$ and $0<y<1$, and the nonmagnetic layers are made of Cu.

4) The magnetic layers are made of an alloy represented by formula $Ni_{1-y}(Fe_{1-x}Co_x)_y$, where $0\leq x\leq 0.9$ and $0.7\leq y<1$, and the nonmagnetic layers are made of Cr.

In order to obtain a sufficiently large magnetoresistance ratio ($\Delta R/R$), the thickness $t_M$ (as expressed in terms of Angstrom or A) of a magnetic layer preferably falls within the range represented by $2A\leq t_M\leq 100A$, while the thickness $t_N$ (as expressed in terms of Angstrom or A) of a nonmagnetic layer preferably falls within the range represented by $2A\leq t_N\leq 100A$. More preferably, they fall within the range represented by $7A\leq t_M\leq 90A$ and $9A\leq t_N\leq 50A$ respectively.

The relationship between the thickness of a nonmagnetic layer and the magnetoresistance ratio can be graphically expressed in a manner as shown in FIG. 2. Since the magnetoresistance ratio oscillatory changes as a function of the thickness $t_N$ of the nonmagnetic layer, the thickness $t_N$ is preferably found within the range represented above so as to show a large magnetoresistance ratio. On the other hand, as is shown in FIG. 3, the saturated magnetic field also cyclically changes as a function of the thickness of the nonmagnetic layer with the peaks substantially agreeing with those of the magnetoresistance ratio. Therefore, it may be understood that the thickness of the nonmagnetic layer should be so determined that the magnetoresistance ratio and the saturated magnetic field has a relationship optimal to the specific application of the element. FIGS. 2 and 3 illustrate the result of an experiment conducted at room temperature, using multilayer comprising sixteen magnetic layers made of $Fe_{0.1}Co_{0.9}$ and having a thickness of 10A and a same number of nonmagnetic layers made of copper and having different thicknesses which are found within the above range.

The number of combined layers is preferably between 5 and several tens. While a larger number may be advantageous from the viewpoint of magnetoresistance ratio, the effect reaches a saturated level and will not be improved any further if the number is large. Therefore, it is preferable that the number of combined layers is defined within a range where the magnetoresistance effect does not get to a saturated level.

The material to be used for the substrate for a multilayer according to the present invention does not need to be specifically defined. Materials that can be used for the substrate include SiO, MgO spinel, and Si.

The multilayer described above can be prepared by means of ordinary thin film forming techniques involving an initial vacuum level of $10^{-7}$ Torr or less (or a pressure equal to $10^{-7}$ Torr or more) such as the RF magnetron sputtering method, the ion beam sputtering (IBS) method and the vacuum evaporation method as well as techniques involving a supervacuum condition such as the molecular beam epitaxy method and the supervacuum sputtering method.

A magnetoresistance effect element utilizing a conventional artificial lattice film that comprises magnetic layers made of a single element such as $(Co/Cu)_n$ and $(Fe/Cr)_n$ shows a magnetoresistance ratio between 20 and 50% if it is prepared by a film forming apparatus utilizing a supervacuum method such as UHV. However, the magnetoresistance ratio of the element falls to an unsatisfactory level of several percent if it is prepared by an apparatus involving an ordinary initial vacuum level. To the contrary, a magnetoresistance effect element according to the present invention can be prepared by an ordinary film forming apparatus to show a sufficient magnetoresistance ratio for practical use.

It should be noted that neither the magnetic nor the nonmagnetic layers of the multilayer of a device according to the invention need to have an identical chemical composition and ah identical thickness.

Now, the present invention will be described by way of examples.

EXAMPLE 1

In this example, magnetic layers were made of a $Fe_{0.1}Co_{0.9}$ alloy and nonmagnetic layers were made of Cu.

The ion beam sputtering method was used to prepare multilayer.

A quartz substrate was placed in a chamber and the inside of the chamber was evacuated to $5\times10^{-7}$ Torr. Then, Ar gas was introduced into the chamber to raise the pressure to $1\times10^{-4}$ Torr and a sputtering operation was carried out, using an accelerating voltage of 500V and a beam current of 30 mA. Three different types of targets made of iron Fe, $Fe_{0.1}Co_{0.9}$ alloy Cu were used. Firstly, an Fe target was sputtered to form a buffer layer having a thickness of 50A on the quartz substrate. Subsequently, a Cu target and a, $_{0.1}Co_{0.9}$ alloy, target were alternately sputtered fifteen times to stack fifteen unit layers each comprising a nonmagnetic Cu layer having a thickness of 9A and a magnetic $Fe_{0.1}Co_{0.9}$ alloy layer having a thickness of 7A, (the number of the unit layer is 15), thereby forming the multilayer as shown in FIG. 1. The multilayer is referred to $(Fe_{0.1}Co_{0.9}7A/Cu9A)_{15}$.

While a buffer layer was formed in the above embodiment, the buffer layer is not necessarily required for the purpose of the present invention.

Then, the magnetoresistance effect of the prepared multilayer was measured by means of the conventional four points method, which is commonly used in the field of the present invention. FIG. 4 illustrates the result of the measurement. In FIG. 4, the transverse and vertical axes respectively indicates the intensity of magnetic field and the normalized electric resistance (R/R (H=0)), when the resistance of the element is 1 under the condition of the magnetic field intensity of 0, so that the relationship between the magnetoresistance effect and the electric resistance of the element is illustrated there. The magnetoresistance ratio $\Delta R/R$ was determined from the graph to show the magnetoresistance effect of the element. It was 7.5%, or a satisfactorily large value. It was confirmed that the multilayer which used a $Fe_{0.1}Co_{0.9}$ alloy for the magnetic layers and Cu for the nonmagnetic layers was suitable for a magnetoresistance effect element.

EXAMPLE 2

In this example, magnetic layers were made of a $Fe_{0.25}Co_{0.75}$ alloy the nonmagnetic layers were made of Cu. The ion beam sputtering method was used to prepare multilayer.

Firstly, an Fe buffer layer having a thickness of 50A was formed on a quartz substrate. Subsequently, Cu and $Fe_{0.25}Co_{0.75}$ alloy targets were alternately sputtered fifteen times to stack fifteen unit layers each comprising nonmagnetic Cu layers having a thickness of 9A and magnetic $Fe_{0.25}Co_{0.75}$ alloy layers having a thickness of 7A (the number of the unit layer is 15), thereby forming multilayer, as shown in FIG. 1. A condition of film formation was identical with that of Example 1. The multilayer is referred to $(Fe_{0.25}Co_{0.75}7A/Cu9A)_{15}$.

Then, the magnetoresistance effect of the prepared multilayer was measured by means of the conventional four points method. FIG. 5, which appears similar to FIG. 4, illustrates the result of the measurement. The magnetoresistance ratio $\Delta R/R$ was determined from the graph to show the magnetoresistance effect of the element. It was 11.1%, or a satisfactorily large value. It was confirmed that the multilayer which used a $Fe_{0.25}Co_{0.75}$ alloy for the magnetic layers and Cu for the nonmagnetic layers was suitable for a magnetoresistance effect element.

EXAMPLE 3

In this example, magnetic layers were made of a $Fe_{0.1}Co_{0.9}$ alloy and nonmagnetic layers were made of Cu. The ion beam sputtering method was used to prepare multilayer. Silicon coated with an oxide film having a thickness of approximately 1,000A was used as a substrate.

Cu and $Fe_{0.1}Co_{0.9}$ alloy targets were alternately sputtered fifteen times to stack fifteen unit layers each comprising a nonmagnetic Cu layer having a thickness of 9A and a magnetic $Fe_{0.1}Co_{0.9}$ alloy layer having a thickness of 15A (the number of the unit layer is 15), thereby forming the multilayer, as shown in FIG. 1. A condition of film formation was identical with that of Example 1. The multilayer is referred to $(Fe_{0.1}Co_{0.9}15A/Cu9A)_{15}$.

Figure 6:
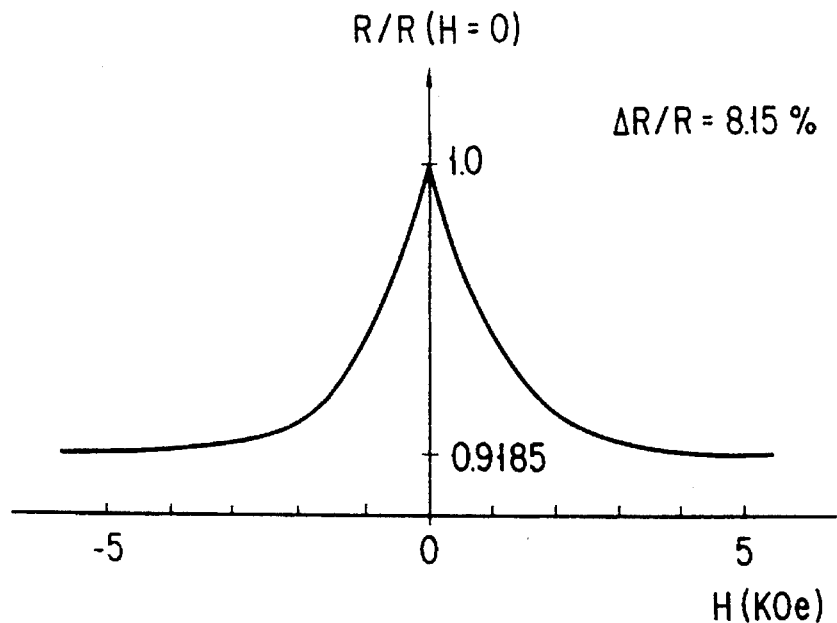
FIG. 6 is a graph showing the magnetoresistance curve of Example 3.

Then, the magnetoresistance effect of the prepared multilayer was measured by means of the conventional four point method. FIG. 6, which appears similar to FIG. 4, illustrates the result of the measurement. The magnetoresistance ratio $\Delta R/R$ was determined from the graph to show the magnetoresistance effect of the element. It was 8.15%, or a satisfactorily large value. It was confirmed that the multilayer which used a $Fe_{0.1}Co_{0.9}$ alloy for the magnetic layers and Cu for the nonmagnetic layers was suitable for a magnetoresistance effect element.

EXAMPLE 4

In this example, magnetic layers were made of a $Fe_{0.75}Co_{0.25}$ alloy nonmagnetic layers were made of Cr. The ion beam sputtering method was used to prepare multilayer. MgO (100) single crystal was used as a substrate.

Cr and $Fe_{0.75}Co_{0.25}$ alloy targets were alternately sputtered fifteen times to stack fifteen unit layers each comprising a nonmagnetic Cr layer having a thickness of 13A and a magnetic $Fe_{0.75}Co_{0.25}$ alloy layer having a thickness of 20A (the number of the unit layer is 15), thereby forming the multilayer, as shown in FIG. 1. A condition of film formation was identical with that of Example 1. The multilayer is referred to $(Fe_{0.75}Co_{0.25}20A/Cr13A)_{15}$.

Figure 7:
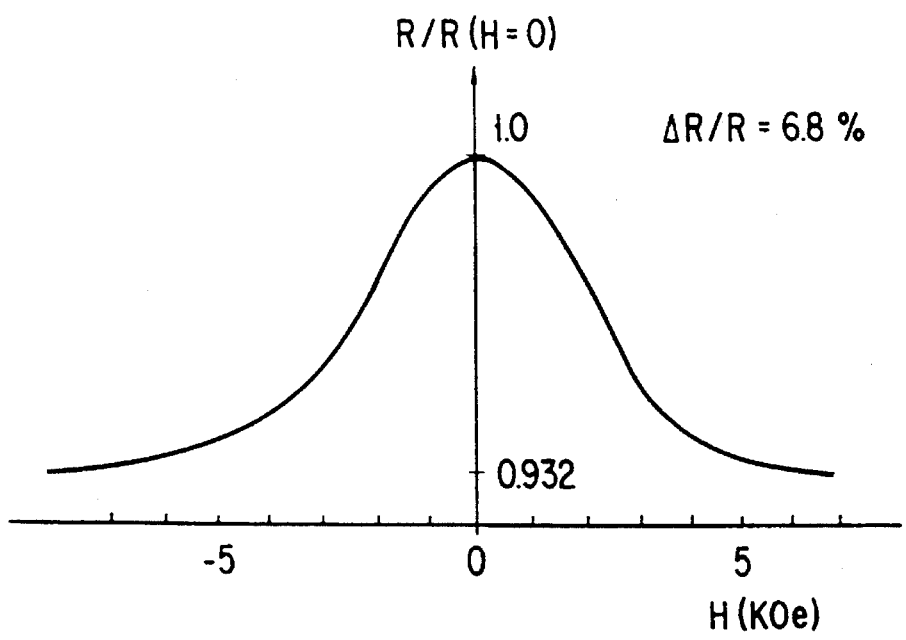
FIG. 7 is a graph showing the magnetoresistance curve of Example 4.

Then, the magnetoresistance effect of the prepared multilayer was measured by means of the conventional four point method. FIG. 7, which appears similar to FIG. 4, illustrates the result of the measurement. The magnetoresistance ratio $\Delta R/R$ was determined from the graph to show the magnetoresistance effect of the element. It was 6.8%, or a satisfactorily large value. It was confirmed that the multilayer of this example was suitable for a magnetoresistance effect element.

EXAMPLE 5

In this example, magnetic layers were made of a $Ni_{0.4}(Fe_{0.5}Co_{0.5})_{0.6}$ alloy and nonmagnetic layers were made of Cu. The ion beam sputtering method was used to prepare multilayer. Silicon coated with a oxide film having a thickness of approximately 1,000A was used as a substrate.

Cu and $Ni_{0.4}(Fe_{0.5}Co_{0.5})_{0.6}$ alloy targets were alternately sputtered fifteen time to stack fifteen unit layers each comprising a nonmagnetic Cu layer having a thickness of 9A and a magnetic $Ni_{0.4}(Fe_{0.5}Co_{0.5})_{0.6}$ alloy layer having a thickness of 15A (the number of the unit layer is 15), thereby forming the multilayer, as shown in FIG. 1. A condition of film formation was identical with that of Example 1. The multilayer is referred to $(Ni_{0.4}(Fe_{0.5}Co_{0.5})_{0.6}15A/Cu9A)_{15}$.

Figure 8:
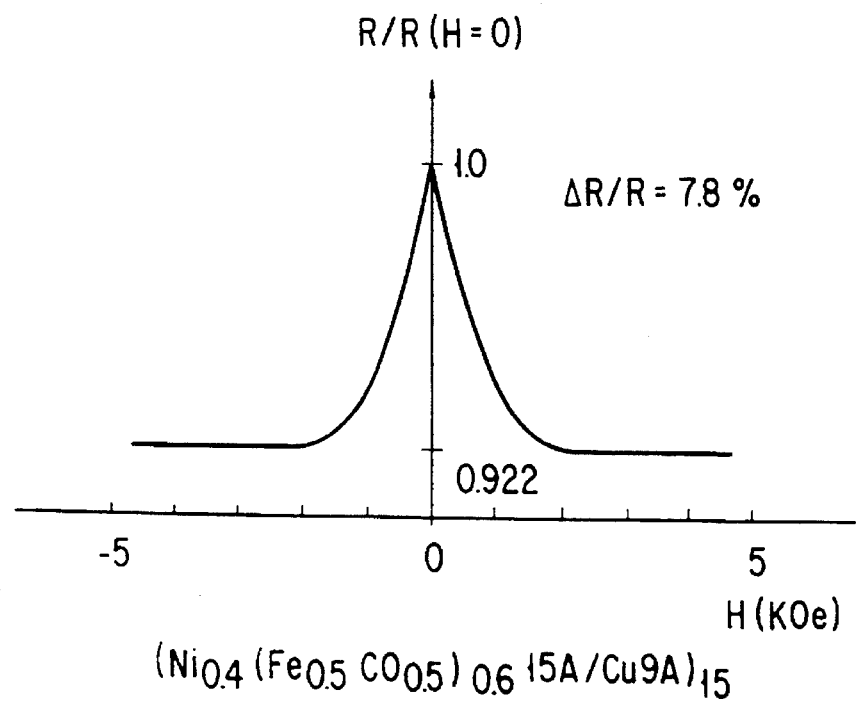
FIG. 8 is a graph showing the magnetoresistance curve of Example 5.

Then, the magnetoresistance effect of the prepared multilayer was measured by means of the conventional four points method. FIG. 8, which appears similar to FIG. 4, illustrates the result of the measurement. The magnetoresistance ratio $\Delta R/R$ was determined from the graph to show the magnetoresistance effect of the element. It was 7.8%, or a satisfactorily large value. It was confirmed that the multilayer of this example was suitable for a magnetoresistance effect element.

EXAMPLE 6

In this example, magnetic layers were made of a $Ni_{0.25}(Fe_{0.75}Co_{0.25})_{0.75}$ alloy and nonmagnetic layers were made of Cr. The ion beam sputtering method was used to prepare multilayer. MgO (100) single crystal was used as a substrate.

Cr and $Ni_{0.25}(Fe_{0.75}Co_{0.25})_{0.75}$ alloy targets were alternately sputtered fifteen times to stack fifteen unit layers each comprising a nonmagnetic Cr layer having a thickness of 13A and a magnetic $Ni_{0.25}(Fe_{0.75}Co_{0.25})_{0.75}$ alloy layer having a thickness of 20A (the number of the unit layer is 15), thereby forming the multilayer, as shown in FIG. 1. A condition of film formation was identical with that of Example 1. The multilayer is referred to $(Ni_{0.25}(Fe_{0.75}Co_{0.25})_{0.75}20A/Cu13A)_{15}$.

Figure 9:
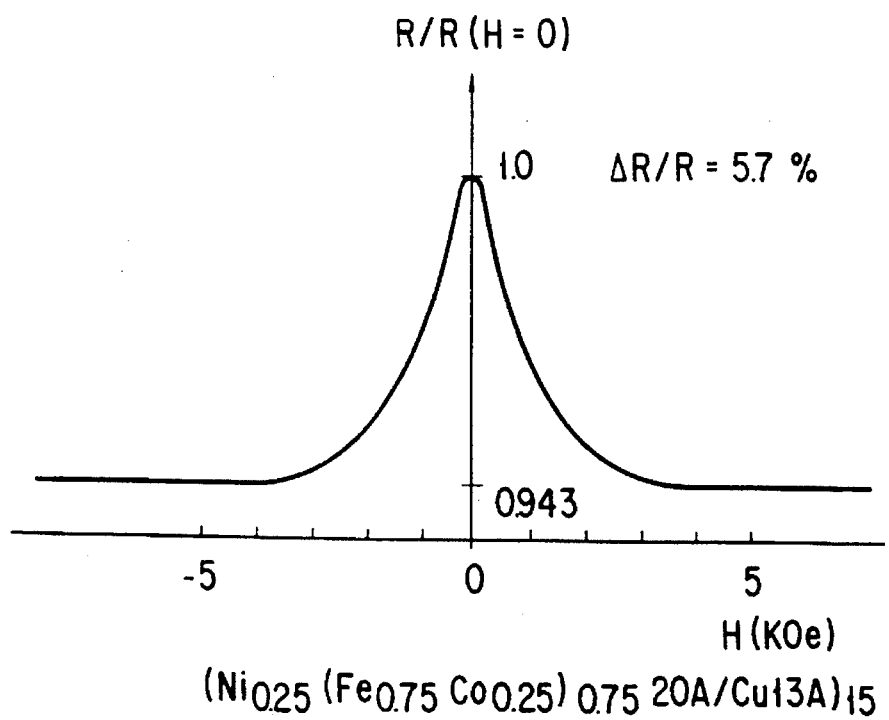
FIG. 9 is a graph showing the magnetoresistance curve of Example 6.

Then, the magnetoresistance effect of the prepared multilayer was measured by means of the conventional four points method. FIG. 9, which appears similar to FIG. 4, illustrates the result of the measurement. The magnetoresistance ratio $\Delta R/R$ was determined from the graph to show the magnetoresistance effect of the element. It was 5.7%, or a satisfactorily large value. It was confirmed that this multilayer was suitable for a magnetoresistive effect element.

Comparative Example 1

In this comparison example, magnetic layers were made of Co and nonmagnetic layers made of Cu. The ion beam sputtering method was used to prepare multilayer. Quartz was used as substrate.

Firstly, an Fe buffer layer having a thickness of 50A was formed on the quartz substrate. Subsequently, Cu and Co targets were alternately sputtered fifteen times to stack fifteen unit layers each comprising a nonmagnetic Cu layer having a thickness of 9A and a Co layer having a thickness of 7A (the number of the unit layer is 15), thereby forming multilayer, as shown in FIG. 1. A condition of film formation was identical with that of Example 1. The multilayer is referred to $(Co7A/Cu9A)_{15}$.

Figure 10:
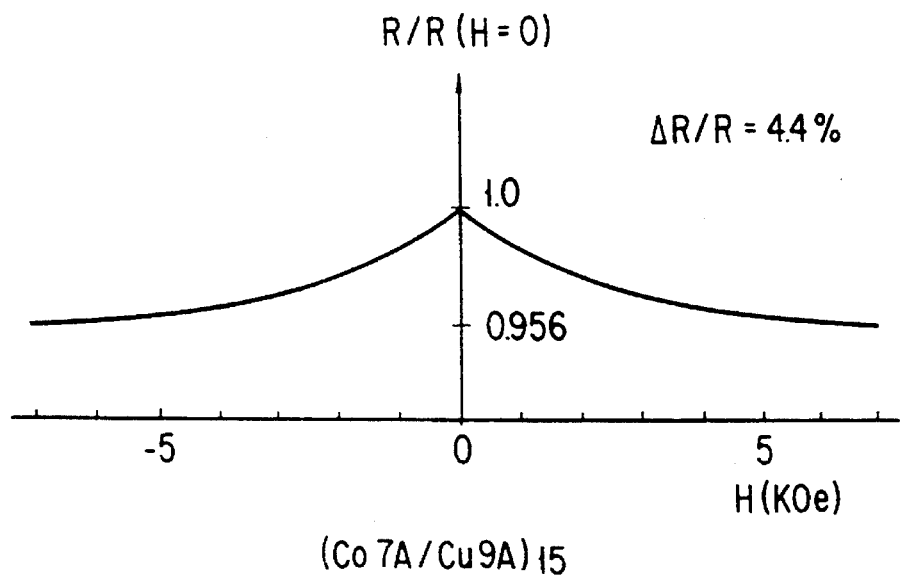
FIG. 10 is a graph showing the magnetoresistance curve of Comparison Example 1.

Then, the magnetoresistance effect of the prepared multilayer was measured by means of the conventional four points method. FIG. 10, which appears similar to FIG. 4, illustrates the result of the measurement. The magnetoresistance ratio $\Delta R/R$ was determined from the graph to show the magnetoresistance effect of the element. It was 4.4%, or a considerably low value as compared to those of the above examples.

Comparative Example 2

In this comparison example, magnetic layers were made of Fe and nonmagnetic layers made of Cr. The ion beam sputtering method was used to prepare multilayer. A MgO (100) single crystal was used as a substrate.

Cr and Fe targets were alternately sputtered fifteen times to stack fifteen unit layers each comprising a nonmagnetic Cr layer having a thickness of 13A and an Fe layer having a thickness of 20A (the number of the unit layer is 15), thereby forming the multilayer, as shown in FIG. 1. A condition of film formation was identical with that of Example 1. The multilayer is referred to $(Fe20A/Cr13A)_{15}$.

Figure 11:
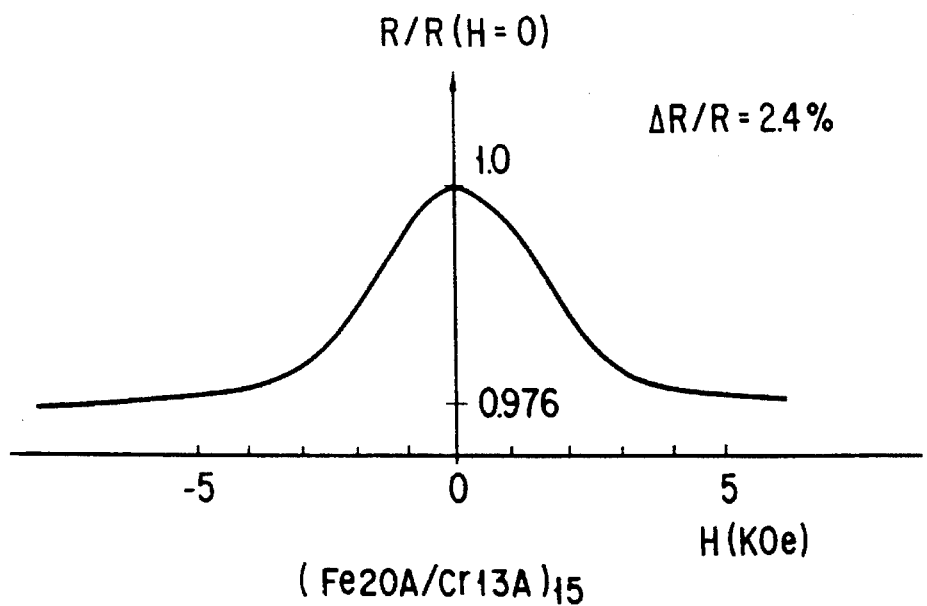
FIG. 11 is a graph showing the magnetoresistance curve of Comparison Example 2.

Then, the magnetoresistance effect of the prepared multilayer was measured by means of the conventional four points method. FIG. 11, which appears similar to FIG. 4, illustrates the result of the measurement. The magnetoresistance ratio $\Delta R/R$ was determined from the graph to show the magnetoresistance effect of the element. It was 2.4%, or a considerably low value as compared to those of the above examples.

EXAMPLE 7

In this example, the magnetic layers were made of a $Fe_{0.1}Co_{0.9}$ alloy nonmagnetic layers were made of Cu. The ion beam sputtering method was used to prepare multilayer. The condition under which the multilayer was prepared was different from that of Example 1.

The inventors of the present invention found that the magnetoresistance ratio of the multilayer is very sensitive to the accelerating voltage at the time of film formation. Therefore, the operation of film formation was conducted for this example with the accelerating voltage raised to 600V and the beam current maintained to 30 mA. The attained vacuum level and the Ar partial pressure were same as those of Example 1.

Firstly, a magnetic $Fe_{0.1}Co_{0.9}$ layer was formed on a substrate of MgO (110) single crystal to the thickness of 10A and a nonmagnetic Cu layer was formed thereon to the thickness of 10A to produce an unit layer. Then, other fifteen unit layers, which were identical with the first one, were sequentially formed on the first unit layer to produce the multilayer having a total of sixteen unit layers. The multilayer is referred to $(Fe_{0.1}Co_{0.9}10A/Cu10A)_{16}$.

For the purpose of comparison, similar multilayer comprising sixteen unit layers, each consisting of a magnetic layer and a nonmagnetic layer, was prepared in the same way except that the magnetic layers were made of Co. This multilayer is referred to $(Co10A/Cu10A)_{16}$.

Then, the magnetoresistance effect of each of the prepared multilayer was measured by means of the conventional four points method to determine the magnetoresistance ratio $\Delta R/R$ of the multilayer. It was 39.4% for $(Fe_{0.1}Co_{0.9}10A/Cu10A)_{16}$ and 31.5% for $(Co10A/Cu10A)_{16}$. Thus, it was confirmed that $(Fe_{0.1}Co_{0.9}10A/Cu10A)_{16}$ comprising magnetic layers made of an alloy had a higher magnetoresistance ratio.

EXAMPLE 8

In this example, the magnetic layers were made of a $Fe_{0.1}Co_{0.9}$ alloy nonmagnetic layers were made of a CuAu alloy. The ion beam sputtering method was used to prepare multilayer.

In the preparation of the multilayer under a condition which as identical with that of Example 7, firstly an Fe buffer layer was formed on a quartz substrate to a thickness of 50A. Then, a nonmagnetic CuAu layer was formed thereon to a thickness of 10A and a magnetic $Fe_{0.1}Co_{0.9}$ layer was formed further on the nonmagnetic CuAu layer to a thickness of 20A to produce an unit layer. Fifteen more unit layers were sequentially formed on the first unit layer to produce the multilayer having a total of sixteen unit layers. The multilayer is referred to $(Fe_{0.1}Co_{0.9}20A/CuAu10A)_{16}$.

For comparison, similar multilayer comprising sixteen unit layers, each consisting of a magnetic layer and a nonmagnetic layer, was prepared in the same way except that the magnetic layers were made of Co. This multilayer is referred to (Co20A/CuAu10A)$_{16}$.

Then, the magnetoresistance effect of each of the prepared multilayer was measured by means of the conventional four points method to determine the magnetoresistance ratio $\Delta R/R$ of the multilayer. It was 20.2% for (Fe$_{0.1}$Co$_{0.9}$20A/CuAu10A)$_{16}$ and 17.8% for (Co20A/CuAu10A)$_{16}$. Thus, it was confirmed that (Fe$_{0.1}$Co$_{0.9}$20A/CuAu10A)$_{16}$ comprising magnetic layers made of an alloy had a higher magnetoresistance ratio.

EXAMPLE 9

In this example, the magnetic layers were made of a Fe$_{0.1}$Co$_{0.9}$ alloy and nonmagnetic layers were made of Au. The ion beam sputtering method was used to prepare multilayer.

In the preparation of the multilayer under a condition which as identical with that of Example 7, firstly an Fe buffer layer was formed on a quartz substrate to a thickness of 50A. Then, a nonmagnetic Au layer was formed thereon to a thickness of 10A and a magnetic Fe$_{0.1}$Co$_{0.9}$ layer was formed on the nonmagnetic Au layer to a thickness of 20A to produce a unit layer. Fifteen more unit layers were sequentially formed on the first unit layer to produce the multilayer having a total of sixteen unit layers. The multilayer is referred to (Fe$_{0.1}$Co$_{0.9}$20A/Au10A)$_{16}$.

For comparison, similar multilayer comprising sixteen unit layers, each consisting of a magnetic layer and a nonmagnetic layer, were prepared in the same way except that the magnetic layers were made of Co. This multilayer is referred to (Co20A/Au10A)$_{16}$.

Then, the magnetoresistance effect of each of the prepared multilayer was measured by means of the conventional four points method to determine the magnetoresistance ratio $\Delta R/R$ of the multilayer. It was 15.3% for (Fe$_{0.1}$Co$_{0.9}$20A/Au10A)$_{16}$ and 10.8% for (Co20A/Au10A)$_{16}$. Thus, it was confirmed that (Fe$_{0.1}$Co$_{0.9}$20A/CuAu10A)$_{16}$ comprising magnetic layers made of an alloy had a higher magnetoresistance ratio.

EXAMPLE 10

In this example, the magnetic layers were made of a Ni$_{0.8}$Fe$_{0.2}$ alloy and nonmagnetic layers were made of Cu. The ion beam sputtering method was used to prepare multilayer.

In the preparation of multilayer under a condition which as identical with that of Example 7, firstly an Fe buffer layer was formed on a quartz substrate to the thickness of 50A. Then, a nonmagnetic Cu layer was formed thereon to a thickness of 10A and a magnetic Ni$_{0.8}$Fe$_{0.2}$ layer was formed on the nonmagnetic Cu layer also to the thickness of 10A to produce an unit layer. Fifteen more unit layers were sequentially formed on the first unit layer to produce the multilayer having a total of sixteen unit layers. The multilayer is referred to Ni$_{0.8}$Fe$_{0.2}$10A/Cu10A)$_{16}$.

For comparison, similar multilayer comprising sixteen unit layers, each consisting of a magnetic layer and a nonmagnetic layer, were prepared in the same way except that the magnetic layers were made of Ni. This multilayer is referred to (Ni10A/Cu10A)$_{16}$.

Then, the magnetoresistance effect of each of the prepared multilayer was measured by means of the convention four points method to determine the magnetoresistance ratio $\Delta R/R$ of the multilayer. It was 18.3% for (Ni$_{0.8}$Fe$_{0.2}$10A/Cu10A)$_{16}$ and 10.1% for (Ni10A/Cu10A)$_{16}$. Thus, it was confirmed that (Ni$_{0.8}$Fe$_{0.2}$10A/Cu10A)$_{16}$ comprising magnetic layers made of an alloy had a higher magnetoresistance ratio.

EXAMPLE 11

In this example, magnetic layers were made of a Ni0.8Fe$_{0.2}$ alloy and nonmagnetic layers were made of Au. The ion beam sputtering method was used to prepare multilayer.

In the preparation of the multilayer under a condition which as identical with that of Example 7, firstly an Fe buffer layer was formed on a quartz substrate to a thickness of 50A. Then, a nonmagnetic Au layer was formed thereon to a thickness of 10A and a magnetic Ni$_{0.8}$Fe$_{0.2}$ layer was formed on the nonmagnetic Au layer to a thickness of 20A to produce a unit layer. Fifteen more unit layers were sequentially formed on the first unit layer to produce the multilayer having a total of sixteen unit layers. The laminate is referred to Ni$_{0.8}$Fe$_{0.2}$20A/Au10A)$_{16}$.

For comparison, similar multilayer comprising sixteen unit layers, each consisting of a magnetic layer and a nonmagnetic layer, was prepared in the same way except that the magnetic layers were made of Ni. This multilayer is referred to (Ni20A/Au10A)$_{16}$.

Then, the magnetoresistance effect of each of the prepared multilayer was measured by means of the conventional four points method to determine the magnetoresistance ratio $\Delta R/R$ of the multilayer. It was 13.4% for (Ni$_{0.8}$Fe$_{0.2}$20A/Au10A)$_{16}$ and 8.2% for (Ni20A/Au10A)$_{16}$. Thus, it was confirmed that (Ni$_{0.8}$Fe$_{0.2}$20A/Au10A)$_{16}$ comprising magnetic layers made of an alloy had a higher magnetoresistance ratio.

EXAMPLE 12

In this example, magnetic layers were made of Permalloy of Ni$_{0.8}$Fe$_{0.2}$ and nonmagnetic layers were made of Cu. The ion beam sputtering method was used to prepare multilayer.

A MgO (110) single crystal substrate was placed in a chamber and the inside of the chamber was evacuated to $5\times10^{-7}$ Torr. Then, Ar gas was introduced into the chamber to raise the pressure to $1\times10^{-4}$ Torr and a sputtering operation was carried out, using an accelerating voltage of 700V and a beam current of 30 mA. Two different types of targets made of a Ni$_{0.8}$Fe$_{0.2}$ alloy and Cu were used. Firstly, a magnetic Ni$_{0.8}$Fe$_{0.2}$ layer was formed on the MgO (110) substrate and then a nonmagnetic copper (Cu) layer was formed thereon to produce a unit layer. Thereafter, fifteen more unit layers were sequentially formed on the first unit layer to produce the multilayer comprising a total of sixteen unit layers.

Figure 12:
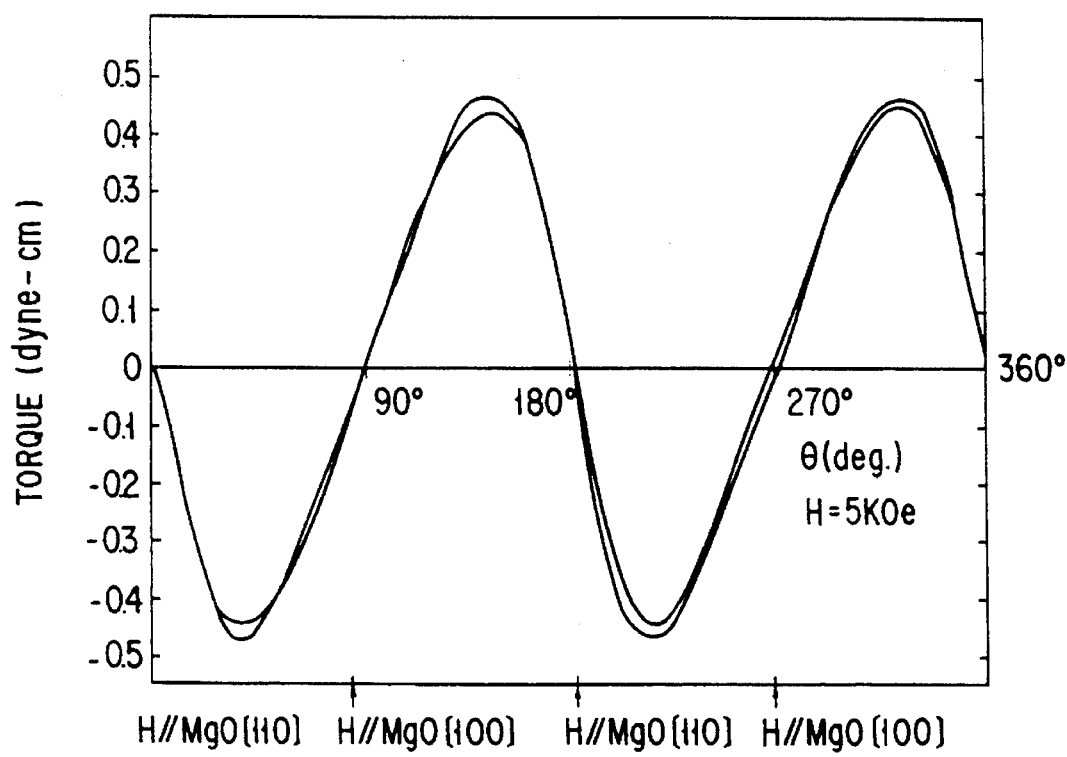
FIG. 12 is a graph showing torque curve of Example 12.

FIG. 12 shows a torque curve of the multilayer. Since the torque curve is twofold symmetry as shown in FIG. 12, it was confirmed that the magnetic layers have in-plane uniaxial magnetic anisotropy.

Figure 13:
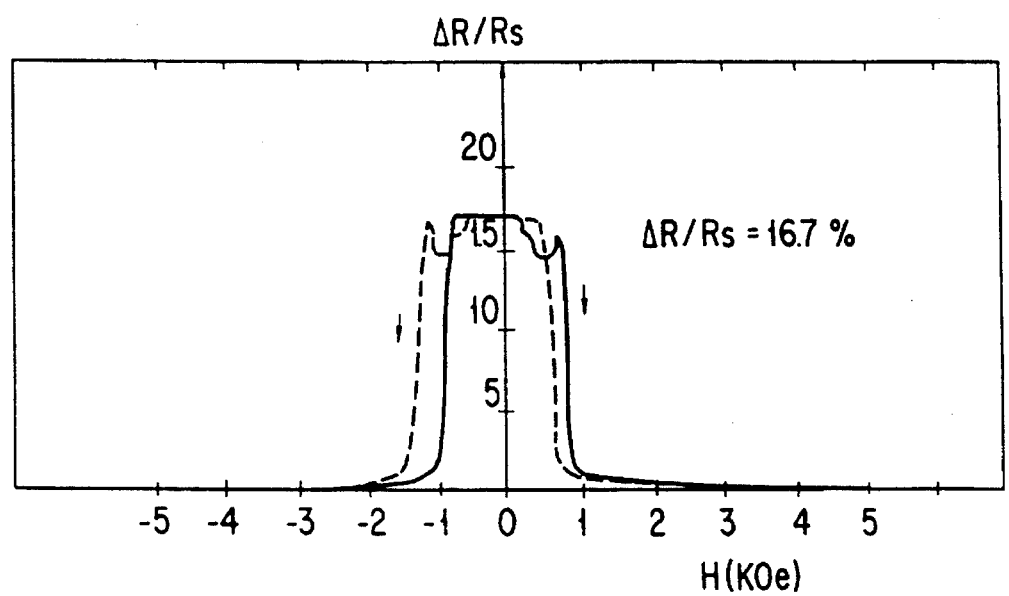
FIG. 13 is a graph showing the magnetoresistance curve of Example 12.

FIG. 13 is a graph showing the magnetoresistance effect of the element along the direction of the axis of easy magnetization of the magnetic layers. It was confirmed that the saturated magnetic field $H_S$ of the element was as low as 1.2 kOe, while its magnetoresistance ration was as high as 16.7%, as shown in FIG. 13.

When the multilayer having the same structure of above-described multilayer was formed on a SiO2 substrate, it was found that no uniaxial magnetic anisotropy was obtained and its magnetoresistance ratio was 5.5%.

As shown in FIG. 13, the resistance of the element began to change around 1.0 kOe and rapidly saturated with a small change of approximately 20 Oe in the magnetic field, making the graph rise and fall very sharply. It may be apparent that a highly sensitive magnetic field sensor can be realized by utilizing these sharply rising and falling areas.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A magnetoresistance effect element, comprising a multilayer formed by alternately stacking at least two magnetic layers and at least one non-magnetic layer in a manner to produce a magnetoresistance effect, said magnetic layers consisting essentially of an alloy represented by $Fe_{1-x}Co_x$, wherein $0.5 \leq X < 1$ and having a thickness of from 2 to 50Å, said non-magnetic layer consisting essentially of an element selected from the group consisting of Cu and an alloy containing at least Cu, said non-magnetic layer having a thickness of from 2 to 100Å.

2. The magnetoresistance effect element as claimed in claim 1, wherein said non-magnetic layer contains Cu.

3. The magnetoresistance effect element as claimed in claim 1, wherein said non-magnetic layer contains an alloy.

* * * * *